United States Patent [19]
Dobson

[11] Patent Number: 5,527,561
[45] Date of Patent: Jun. 18, 1996

[54] METHOD FOR FILING SUBSTRATE RECESSES USING ELEVATED TEMPERATURE AND PRESSURE

[75] Inventor: Christopher D. Dobson, Bristol, United Kingdom

[73] Assignee: Electrotech Limited, Bristol, United Kingdom

[21] Appl. No.: 291,575

[22] Filed: Aug. 16, 1994

Related U.S. Application Data

[63] Continuation-in-part of Ser. No. 147,438, Nov. 5, 1993, abandoned, which is a continuation of Ser. No. 888,819, May 27, 1992, abandoned.

[30] Foreign Application Priority Data

May 28, 1991 [GB] United Kingdom ............ 9111440
Feb. 10, 1992 [GB] United Kingdom ............ 9202745

[51] Int. Cl.⁶ .................................................. B05D 3/02
[52] U.S. Cl. .................... 427/383.3; 427/97; 427/123; 427/124; 427/376.7; 427/397.7; 427/419.7
[58] Field of Search ............... 427/97, 123, 124, 427/376.7, 383.3, 397.7, 419.7

[56] References Cited

U.S. PATENT DOCUMENTS

| | | | |
|---|---|---|---|
| 4,758,533 | 7/1988 | Magee et al. | 437/173 |
| 4,837,051 | 6/1989 | Farb et al. | 427/97 |
| 4,920,070 | 4/1990 | Mukai | 437/173 |
| 5,011,793 | 4/1991 | Obinata | 437/203 |

FOREIGN PATENT DOCUMENTS

| | | |
|---|---|---|
| 0127020 | 12/1984 | European Pat. Off. . |
| 0201713 | 11/1986 | European Pat. Off. . |
| 0251523 | 1/1988 | European Pat. Off. . |
| 0393381 | 10/1990 | European Pat. Off. . |
| 4020324 | 1/1992 | Germany . |
| 63-308350 | 12/1988 | Japan . |
| 2-205678 | 8/1990 | Japan . |
| 2-213471 | 8/1990 | Japan . |
| 3-225829 | 10/1991 | Japan . |

OTHER PUBLICATIONS

Extended Abstracts. vol. 88, No. 2, 9 Oct. 1988, Princeton, New Jersey US p. 361; G. C. Schwartz: "Planarization Processes For Multilevel Metallization".

IBM Technical Disclosure Bulletin. vol. 33, No. 1B, Jun. 1990, New York, US pp. 182–183; "High Aspect Ratio Fill By Multiple Depositions And Reflows".

Patent Abstracts of Japan. vol. 015, No. 514 (E-1150) 27 Dec. 1991 & JP-A-3 225 829 (Fujitsu Ltd.) 4 Oct. 1991 *abstract*.

Primary Examiner—Michael Lusignan
Assistant Examiner—David M. Maiorana
Attorney, Agent, or Firm—Wenderoth, Lind & Ponack

[57] ABSTRACT

To fill a hole or trench structure in an article, such as a semiconductor wafer, a layer is formed on the article. The layer extends over the structure so as to seal the mouth thereof. Then, the wafer and layer are subject to elevated pressure and elevated temperature such as to cause material of the layer to flow into the structure.

4 Claims, 4 Drawing Sheets

METHOD FOR FILING SUBSTRATE RECESSES USING ELEVATED TEMPERATURE AND PRESSURE

This application is a Continuation-In-Part of now abandoned application, Ser. No. 08/147,438, filed Nov. 5, 1993, which in turn is a Continuation of now abandoned application Ser. No. 07/888,819, filed May 27, 1992.

BACKGROUND OF THE INVENTION

1. Field of the Invention

The present invention relates to arrangements in which a layer of material is formed on a surface, so that the material is introduced into holes or trenches in the surface. It is particularly, but not exclusively, concerned with arrangements in which that surface is a surface of a semiconductor wafer (or substrate used for integrated circuits).

2. Summary of the Prior Art

There are a number of situations during the formation of a semiconductor device in a semiconductor wafer where it is necessary to deposit a layer onto the wafer. One such situation arises when conductive or semiconductive tracks are to be formed over the wafer, so that those tracks may make contact with active regions of the device or circuit. Normally, such tracks must then extend through an insulating layer on the surface of the wafer so as to make contact with active regions below that insulating layer, or with further conductive tracks below that insulating layer (when the holes are usually called "vias"). Where the track extends through a hole in this way, it is important that the amount of material e.g. metal filling that hole is sufficient to ensure good electrical contact.

Another situation is when an electrically insulating layer is to be formed over the wafer, in order to isolate active regions and/or conductive tracks from each other, or to form a protective covering known as a passivation layer. Such a layer is often required to cover conductive tracks or other structures on the wafer, and these structures may be close to each other so that the gaps between them form narrow trenches. It is important that the insulating material covers all the surface with sufficient thickness to provide good electrical insulation, and that the top surface of the insulating layer shall be sufficiently smooth for the next stage of wafer processing.

The normal way of forming layers on the surface of a semiconductor wafer, is by the use of a deposition technique, such as sputtering for conductive layers, or chemical vapour deposition for insulating layers. In such a technique, the surface on which the layer to be formed is bombarded with particles of the material to be deposited until a layer of a suitable thickness has been achieved.

Where that surface is the surface of a layer with a hole or trench therein extending to the surface of the wafer, the particles of the material are deposited on the sides and base of the hole or trench, but it has been found that there is a tendency for the particles to be deposited primarily at the mouth of the hole or trench, so that the width of the mouth is reduced as the deposition continues. The effect of this is that the interior of the hole or trench may suffer from shadowing, and a suitably thick layer of the material may not be deposited inside the hole before deposition at the mouth of the hole or trench effectively closes the hole or trench and prevents further deposition therein, or before the required thickness has already been deposited elsewhere on the surface. This problem becomes increasingly significant as the width of the structure decreases, and developments in semiconductor technology have resulted in moves towards smaller and narrower structures.

An alternative method of producing a suitable conductive layer is firstly to fill the hole with one metal, and then form the metal layer over the insulation and the filled hole. Thus, the hole may be filled with tungsten using a technique such as chemical vapour deposition, and when a more common metal, such as aluminium or aluminium alloy may be deposited over the surface by the sputtering technique discussed above. However, the gaseous sources for the materials used to fill the holes by chemical vapour deposition are expensive, and a two-stage process involving different materials is necessary, increasing the cost of the whole device.

Holes can be filled by sputtering at high temperature (>500° C.) and/or using bias sputtering, but the quality of the metal is degraded, and the process is inconsistent and hard to control. Aluminium CVD is possible and does fill holes, but the process is slow, hard to control, and requires previous deposition of a suitable seed layer. Again, a two-stage process involving different materials is then necessary.

There are alternative methods of producing a suitable insulating layer. One method is to deposit part of the required thickness by chemical vapour deposition (CVD), and then to remove the parts of the layer that overhang the trench by sputter etching or reactive ion etching. This cycle may be repeated until sufficient thickness has been deposited, the etching steps being used to prevent the closing of the mouth of the trench. However the process is slow, requires several steps, and must be adjusted for different geometries.

Another method is to deposit an insulating material that can be reflowed by melting, such as silicon oxide doped with boron or phosphorous. The material may be deposited by CVD, and then heated until it flows into the trench. However the temperature required for reflow of such material is greater than 800° C., which will cause melting of any aluminium tracks present, and can cause undesirable diffusion in active regions of devices in the water.

A third method is to apply a liquid solution onto the surface of the wafer, where such liquid when subsequently heated forms a solid insulating layer, such as that known as "spin-on-glass". The material flows into the trenches when first applied. However, the material tends to retain some moisture after the heating process, and this moisture can cause device unreliability due to corrosion. It may require a capping layer to seal against moisture, which increases the number of process steps and hence the device costs.

SUMMARY OF THE INVENTION

The present invention therefore proposes that a layer be formed on the surface of an article, in which surface there is a recess such as a hole or trench, the sides and base of which-are to be provided with a covering so as, e.g. in a wafer, to provide electrical contact or insulation. Then, the article, including the layer, is subjected to elevated pressure and elevated temperature sufficient to cause the layer to deform.

It is thought that the primary factor causing the deformation is plastic flow by dislocation slips, which is activated by the elevated pressure and temperature. Surface diffusion grain boundary diffusion and lattice diffusion may also have an effect, activated by the elevated temperature.

The precise temperature and pressure conditions necessary to achieve the deformation of the layer will depend on the materials used but, for aluminium or aluminium alloys, temperatures in excess of 350° C. and pressures in excess of $20 \times 10^6$ Pa (3,000 p.s.i.) have been found to be suitable, but lower temperature and/or pressures may also be effective. Alloys commonly used for forming conductive tracks are of composition Al/0–2% Si/0–4% Cu/0–2% Ti, and these have been found to deform suitably under such conditions.

The present invention is not limited to one particular method of forming the layer, and sputtering or chemical vapour deposition techniques may be used as discussed above, although other alternatives such as vacuum evaporation or application of a liquid may also be used. Indeed, it is possible for the layer to be pre-formed, as a film, which film is then positioned on the article.

Thus, to form a conductive, insulating or semiconductive layer on a semiconductor wafer, which layer is to extend through holes or trenches in an underlying layer on the surface of the wafer, material for forming the layer (e.g. aluminium or other suitable material) is first deposited on the surface of the underlying layer by e.g. sputtering. The material may then be deposited on the sides and base of the hole or trench, although the thickness at the mouth of the structure will be greater. When a suitable amount of material has been deposited deposition stops and the result is subject to elevated temperatures and pressures for a period sufficiently long to cause movement of the material to fill the structure, or to move into the structure sufficiently to allow a reliable electrical contact if the material is a metal, or to provide a reliable electrical insulation if the material is an insulator.

It is important that the mouth of the structure is completely closed by the deposition, leaving a void below the closed mouth within the structure. Such closing of the mouth of the structure enables the material to be pushed down into the structure, collapsing the void by the elevated pressure outside it. The void will therefore be filled when the material moves under the elevated pressure and temperature conditions. Thus, unlike the prior art arrangements, the closing of the mouth of the structure does not represent a limit to the amount of the material that may, at the end of the procedure, fill the structure to achieve a satisfactory contact or insulator.

Aluminium, or some aluminium alloys, are particularly suitable for use with the present invention because their yield strengths decrease gradually with temperature. Thus, they will deform to move into or fill the hole at temperatures significantly below their melting point. For other materials, since it is often desirable to avoid very high temperatures, it may be difficult to ensure that suitable deformation occurs below the melting point.

However, it may still be possible to achieve this with suitably precise temperature control.

If aluminium is used, temperatures in the range 350° C. to 650° C. and pressures in excess of 3,000 p.s.i. have been found suitable. Indeed, it is believed that the pressures may be as high as $350 \times 10^6$ (50,000 p.s.i.) or even higher enabling the use of temperatures less than 350° C. The duration of such pressure and temperature conditions is also not thought to be critical, and inert or reactive gases may be used to create the high pressure.

It has previously been mentioned that it is important for the mouth of the structure to be completely closed by the deposition, leaving a void below the closed mouth. If the deposition is vertical, or substantially vertical, it has been found that such closing of the mouth requires a long deposition of a thickness at least as great as the width of the hole. It may be desirable to reduce this thickness, so that after subsequent pattern etching of the layer, the step heights are reduced, to ease (for example) subsequent layer step coverage, or photolithography (by reducing the depth of focus field required). Therefore, in a further development of the present invention, it is proposed that the deposition be carried out by magnetron sputtering, such that the flux of material is from a large range of angles to the surface of the wafer, and that the wafer be heated to increase the mobility of the deposited material. Under the correct surface and heat conditions, the material deposited in the hole or trench can flow out of that hole or trench and contribute to the bridging. For magnetron sputter deposition of aluminium alloys, a platen temperature of 350°–450° C. has been found to be suitable, but other temperatures may also enhance the bridging effect.

BRIEF DESCRIPTION OF THE DRAWINGS

An embodiment of the present invention will now be described in detail, by way of example, with reference to the accompanying drawing, in which.

DETAILED DESCRIPTION

Figure 1:
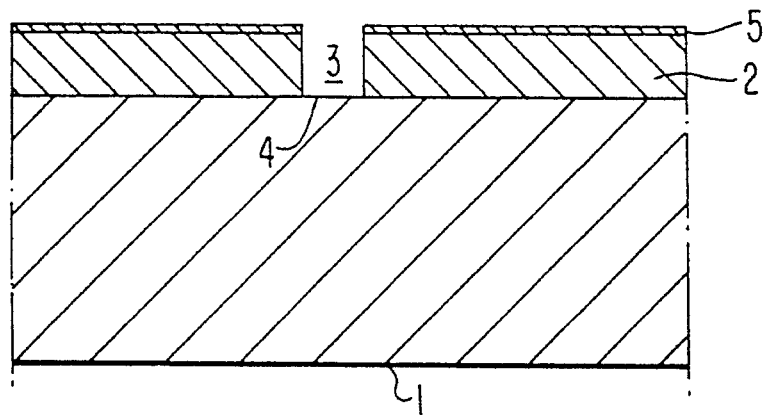
FIG. 1 shows a cross-section of a semiconductor wafer prior to the formation of a layer according to the present invention.

FIG. 1 shows a semiconductor wafer 1 with a pre-existing layer 2 thereon. The wafer 1 itself may contain a plurality of layers and/or regions of different properties, to form a semiconductor device, and will be the result of a fabrication process involving a plurality of stages for forming those layers and/or regions. The internal structure of the wafer 1 is not of significance in the present invention, and therefore these layers and/or regions will not be discussed further.

The layer 2 has a hole or trench structure 3 therein, and the present invention is concerned with the problem of forming a layer over the pre-existing layer 2, e.g. so that either an electrical contact can be made by a metal layer to the surface 4 of the wafer 1 within the hole or trench structure 3, or an electrical insulator can be formed on the surface 4 of the wafer 1 within the hole or trench structure 3, or a layer can be formed that can be made semiconductive in known matter. That surface 4 may thus be in contact with e.g. active regions within the wafer, or further conductive tracks within the structure on the wafer.

Figure 2:
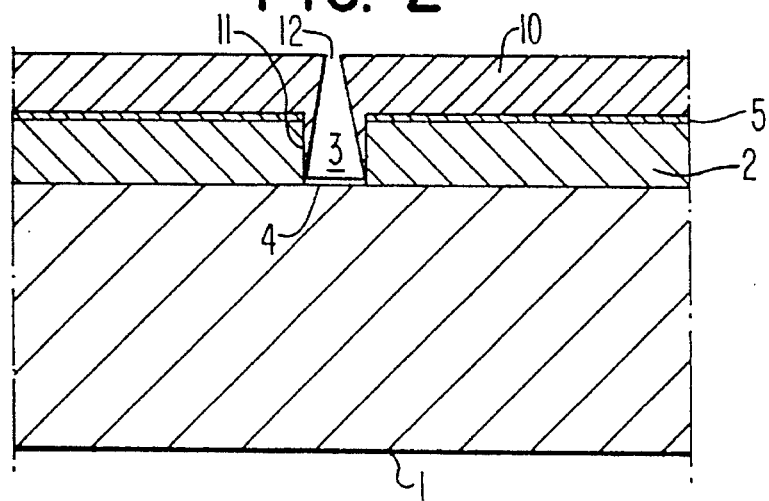
FIG. 2 shows a cross-section of the wafer of FIG. 1, at an intermediate stage in the formation of a layer according to the present invention.

To form a metal layer, a material such as aluminium is sputtered onto the surface of the layer 2 e.g. in a downward or sideways direction in FIG. 1. Sputtering can also be done upwards if desired. To form an insulating layer, a material such as silicon dioxide is deposited onto the surface of the layer 2 by e.g. chemical vapour deposition. This process continues until the new layer over the pre-existing layer 2 has a suitable thickness. This is shown in FIG. 2, with the new layer shown at 10. With such deposition techniques, deposition of the material to form the layer 10 tends to occur more rapidly at the mouth of the structure 3, as compared with its side walls and its base, formed by surface 4. As a result, as shown in FIG. 2, the side walls 11 of the hole or trench structure 3, and the surface 4, have a relatively thin layer of material thereon, as compared with the layer 10 covering the surface of the pre-existing layer 2. It can thus be seen that satisfactorily reliable electrical connection or insulation to the wafer 1 at the surface 4 may not be achieved. Furthermore, it is not normally possible to increase the amount of deposition on the side walls 11 and the surface 4 by continuing the deposition process, because that deposition process will eventually close the gap 12 in the layer 10 above the hole or trench structure 3, preventing further deposition within that structure 3 and leaving a void.

The technique described above represents the currently standard method, and the poor coverage to the surface 4 may thus become a defect or weak point in the device.

Figure 3:
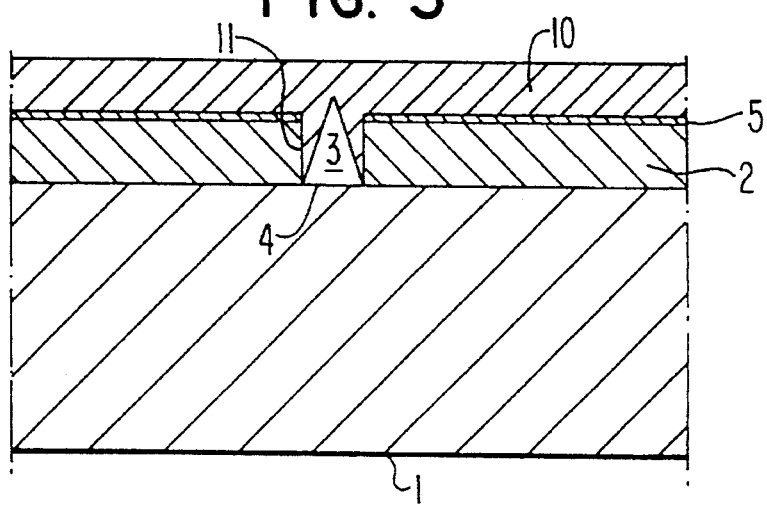
FIG. 3 shows a cross-sectional view of the wafer, after the layer has been completed.

It is important that deposition should close the mouth of the structure. In some case, this may require more thickness than required elsewhere to be deposited, in which case excess material can be removed by etching, after the structure has been filled. FIG. 3 thus shows a processing stage similar to FIG. 2, but in which the mouth of the structure is closed, to have a void below the layer 10. This idea of wholly sealing the void may also be achieved by providing a capping layer over the layer which thus may seal any open voids. Such a capping layer may also improve the configuration of the final surface. Such a capping layer may be any suitable material, and may have a higher Youngs modulus than the layer being capped at the temperature/pressure at which it is to deform. After the wafer has been subject to the elevated temperature/pressure conditions, the capping layer may be removed or may be left in place depending on the material of that capping layer.

Figure 4:
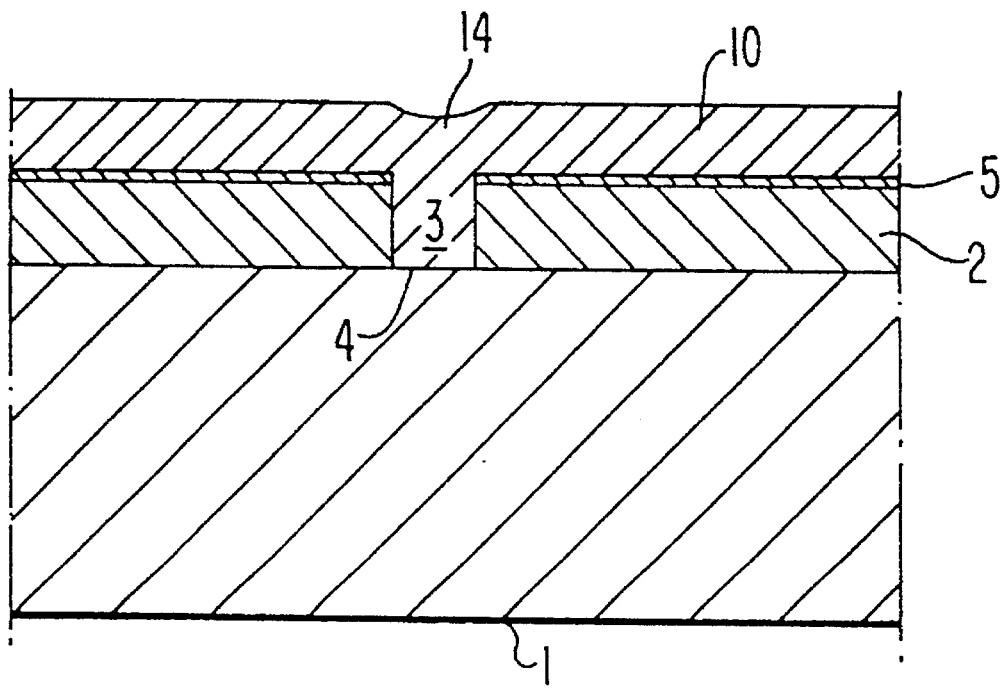
FIG. 4 shows a cross-sectional view of the wafer, after exposure to elevated pressure and elevated temperature.

Therefore, according to the present invention, once the stage of FIG. 3 has been reached, further deposition of the material ceases, and the structure shown in FIG. 3 is then subjected to elevated temperature and pressure, e.g. temperatures above 350° C. to 400° C. and pressures above $20 \times 10^6$ Pa (3,000 p.s.i.), assuming that the material of the layer 10 is aluminium. Such elevated temperature and pressure causes the material of layer 10 to flow proximate the structure 3, and this process may continue until the structure 3 is filled, as shown in FIG. 4. Material 13 then entirely fills the structure 3 and thus a satisfactory electrical contact to, or insulation of, the surface 4 may then be achieved. There may be a small depression 14 in the layer 10 above the structure 3, due to the flow of material 13 into the structure 3 to fill it, but this depression does not affect the electrical properties of the device.

In this way, a satisfactory contact or insulation can be achieved, and it is found that this method is not affected by the width of the structure 3.

Figure 5:
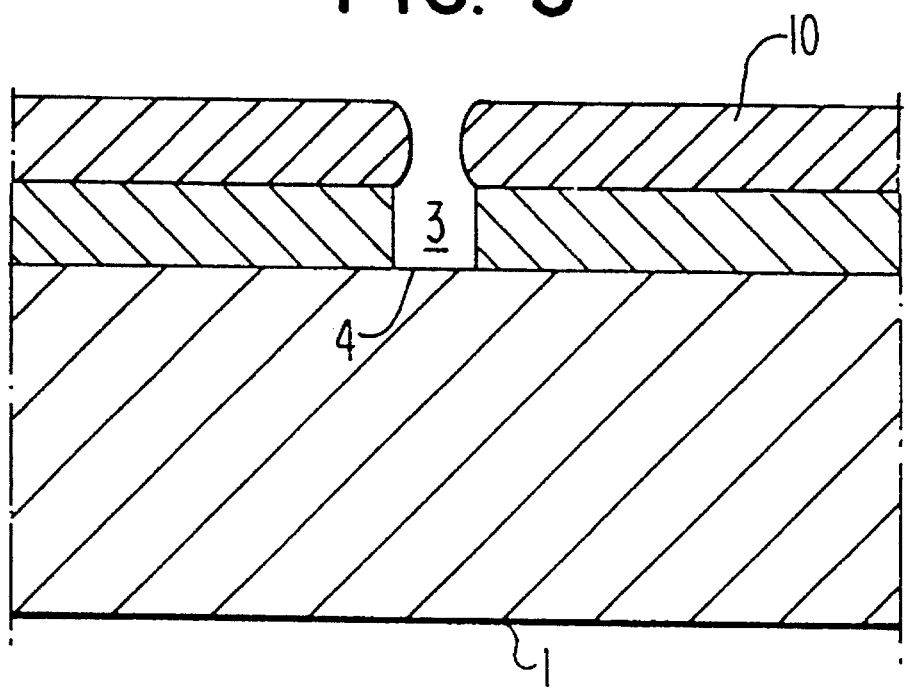
FIG. 5 is a sectional view corresponding to FIG. 2, but for higher temperatures.

As has previously been mentioned, it is important for the layer 10 wholly to cover the hole or trench structure 3, so that the void is sealed. This closing of the mouth of the structure 3 enables the material to be pushed down into the structure 3, because of the pressure differential across the layer 10 at the site of the structure 3. Therefore, there is little advantage to be gained by depositing material within the structure 3, as shown in FIGS. 2 and 3. Although the arrangement described with respect to FIGS. 2 and 3 assumes that a relatively thin layer of material is deposited on the side walls 11 of the structure 3, and the surface 4, such deposition retards closing of the mouth of the structure 3, thereby increasing the thickness of the layer 10 which needs to be deposited in order to close that mouth. However, it has been found if deposition occurs at elevated temperatures, e.g. 400° C. to 450° C., the shape of the layer 10 adjacent the structure 3, before the mouth of the structure 3 is closed, may be different, as shown in FIG. 5. Deposition occurs preferentially at the mouth of the structure 3, thereby speeding up the closing of the mouth of that structure 3. Thus, it is preferable that the layer 10 is deposited at elevated temperatures. For deposition at lower temperatures, the thickness of the layer 10 is normally at least 2 times the width of the structure 3, but this limit may be avoided by use of elevated temperatures as described above.

It should further be noted that it is important that the structure 3 must be wholly filled by the material 13, as shown in FIG. 4. If the pressures are not sufficiently high, or are not maintained for sufficiently long, the flow of material 13 into the structure 3 may not wholly fill it, and consideration must be given to this during the carrying out of the present invention. It may also be desirable to form a barrier layer (5) between the layer 2 and the layer 10. The barrier layer 5 may serve to lubricate or reduce the friction experienced by the deposited layer during deformation. Its presence greatly enhances the reliability of the process. In addition to the materials mentioned below, the barrier layer 5 could be formed by a separately deposited layer of the material forming the layer 10. Furthermore, care needs to be taken if there are a multiplicity of adjacent structures 3, to ensure that there is sufficient material in the layer 10 to fill them all.

Figure 6:
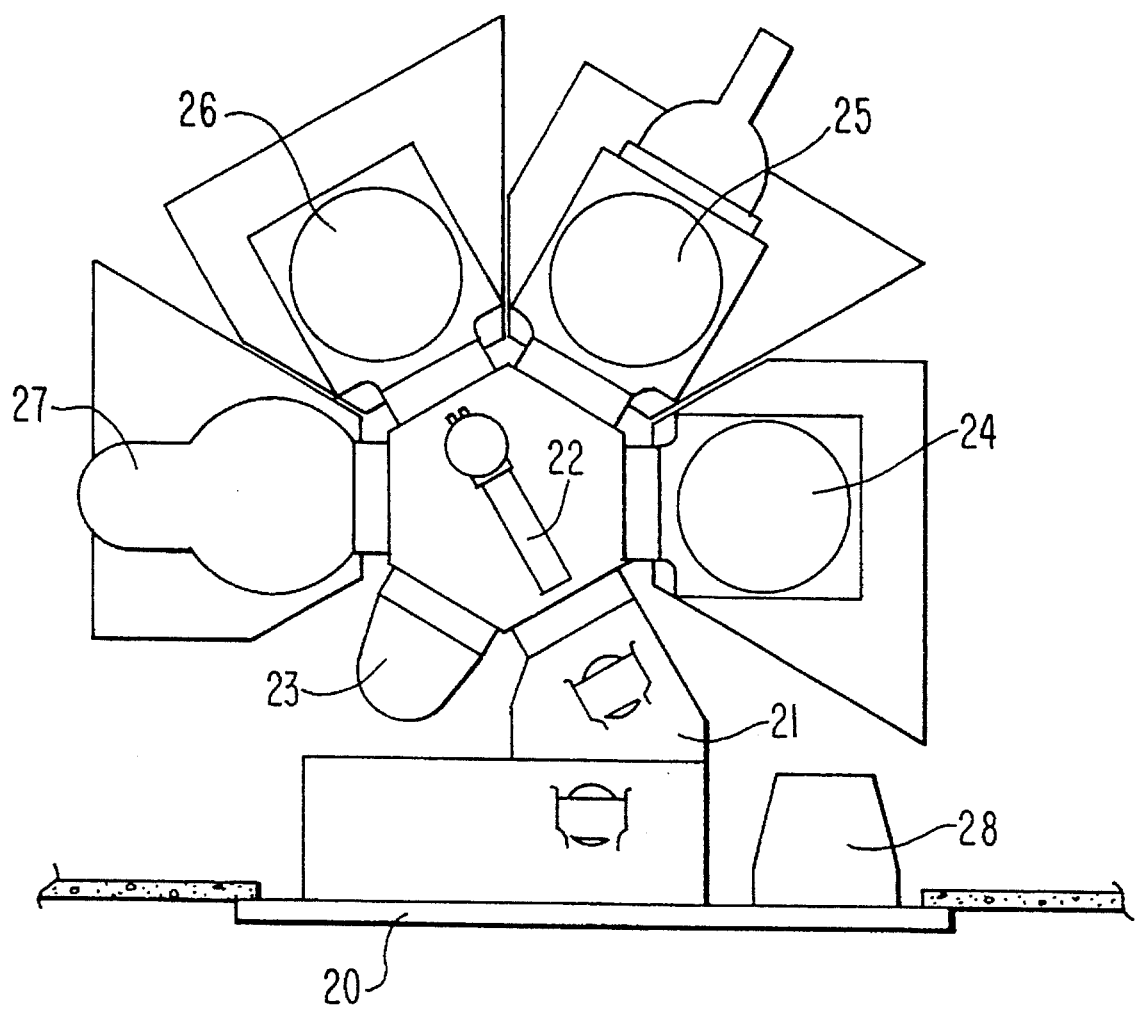
FIG. 6 is a schematic plan view of an apparatus for carrying out the present invention.

An apparatus for carrying out the present invention, when the article is a semiconductor wafer, is shown in FIG. 6. The majority of components of that apparatus are conventional, with the exception of the parts for subjecting the article (wafer) to elevated pressure and temperatures.

Thus, semiconductor wafers are loaded into the apparatus via an interface 20, from which interface 20 the wafers are transferred individually to a lock chamber 21. That lock chamber 21 acts as a seal between the interior of the apparatus, in which the wafer is processed, and the exterior. A transport arm 22, receives a wafer from the lock chamber 21 and transports the wafer successively to one of a series of modules, in which processing of the wafer occurs. Normally, the wafer is pre-heated in a pre-heat module 23. The pre-heating of the wafer, in vacuum, ensures that the wafer is fully out-gased, and temperature of approximately 400° C. are maintained for 60s. For some hydroscopic wafers, a prolonged heating may be necessary.

From the pre-heat module 23, the wafer may be transported by suitable movement and rotation of the transport arm 22, to a sputter etch module 24. This cleans out native oxide from the wafer, and may also further degas the wafer. Such sputter etching is optional.

The processing thus carried out causes, the wafer to be in the state shown in FIG. 1. If, as previously described, a barrier layer is to be formed on the layer 2 before the formation of the layer 10, the wafer is transported to a barrier deposition module 25 either directly from the pre-heat module 23 or from the sputter etch module 24. The barrier layer may be formed in a conventional manner, and may be e.g. of Ti-TiN. The TiN may be deposited by reactive sputtering of pure Ti, and R.F. bias, in-situ oxygen incorporation, or vacuum breaks can be used to increase the integrity of the barrier layer. The typical thickness of the barrier layer, if formed, is of the order of 100 nm. It should be noted that formation of a barrier layer on the structure shown in FIG. 1 is known.

Then, the wafer is transported by the transporter arm 22 to a deposition module 26, in which the layer 10 is deposited. Such deposition may be by known methods, and sputter deposition is preferred. As has previously been mentioned, it is preferable for such deposition to occur at elevated temperatures. The deposition of the layer 10 continues until all hole or trench structures on the article are sealed by the layer 10.

The modules 23 to 26 of the apparatus described above may be conventional. In the conventional arrangement, where a layer 10 is formed, it will not seal the hole or trench structures, but the sealing of such structures may be carried out using a conventional module 26.

Then, according to the present invention, the wafer is transported from the deposition module 26 to a module 27 in which the wafer is subjected to elevated temperatures and pressures so as to cause the layer 10 to deform so that material 13 fills the hole or trench structures, as shown in FIG. 4. The module 27 is shown in more detail in FIG. 7. FIG. 6 also shows a display 28 by which the operator can monitor the movement of the wafer.

Figure 7:
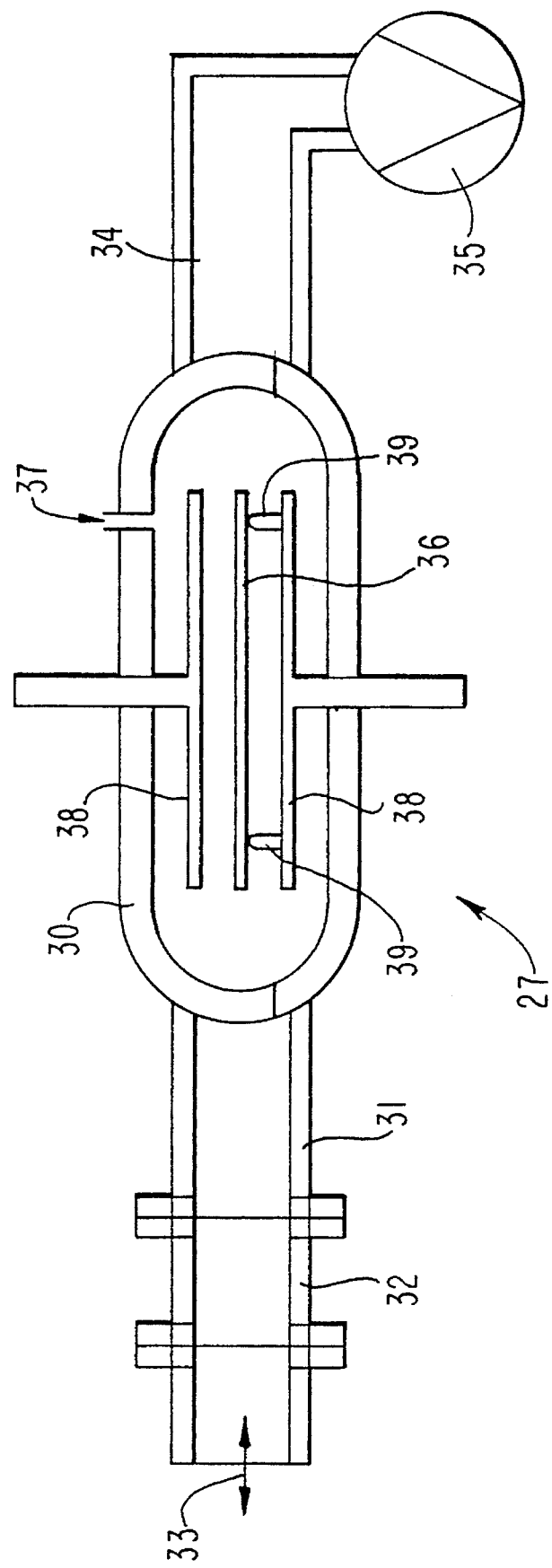
FIG. 7 is a schematic sectional view of the part of the apparatus of FIG. 6, which part subjects the article to elevated pressures and temperatures.

As can be seen from FIG. 7, the module 27 comprises a pressure vessel 30 which is connected via a passageway 31 containing a gate valve 32 to the region of the apparatus containing the transport arm 22. Thus, wafers may be introduced into, and removed from, the pressure vessel 30 via the passageway 31 by opening and closing of gate valve 32, this movement being shown by arrow 33. The interior of the pressure vessel 30 communicates with a vacuum chamber 34 connected to a pump 35. This enables the interior of the pressure vessel 30 to be evacuated. Support pins 39 are provided for supporting a wafer 36 which has been introduced into the pressure vessel 30.

In order to subject the wafer to elevated pressures, the pressure vessel 30 has an inlet 37 connected to e.g. a high pressure Argon source. By filling the interior of the pressure vessel 30 with Argon, the wafer and layers thereon may be subjected to suitably controlled pressures. Furthermore, the pressure vessel 30 contains heating plates 38 which permit the temperature within the pressure vessel 30, and hence the temperature of the wafer to be controlled.

Hence, a wafer 36 introduced into the pressure vessel 30 may be subjected to elevated pressures and temperatures so as to cause a layer 10 formed thereon to form into vias in the wafer.

Thus, although the trend in semiconductor devices is to smaller and smaller dimensions, including smaller dimensions for contact holes, the present invention permits satisfactory electrical contact to be achieved through small contact holes. In the existing techniques using sputtering, as can be seen from consideration of FIG. 2, deposition at the mouth of the hole would rapidly close a small hole, so that the existing techniques offered only poor electrical contact. With the present invention, on the other hand, the closing of the mouth of the hole during the initial deposition of the metal layer, before the elevated temperature and pressure conditions are applied, may improve the success of contact after those elevated pressure and temperature conditions have been applied.

Also the trend is for the spacing of conductive tracks to become closer and the trenches between them narrower, and the present invention permits satisfactory electrical insulation to be achieved between layers, by a similar mechanism and with similar advantages.

What is claimed is:

1. A method of processing a semiconductor wafer having a surface layer having an exposed surface and at least a part of said surface layer having a multiplicity of recesses therein, the method comprising:

depositing a further layer on the exposed surface of at least said part of said surface layer without any melting of said further layer, the depositing of said further layer continuing at least until said further layer extends over all the recesses to close completely the openings of all of said recesses in the exposed surface;

halting the depositing of said further layer; and subsequently subjecting said wafer and said further layer to elevated pressure and an elevated temperature sufficient to cause parts of said further layer to deform, without melting, to fill respective recesses;

wherein the elevated temperature to which said further layer is subjected is significantly below the melting point of said further layer and is sufficient to decrease the yield strength of the material of said further layer to allow filling deformation.

2. A method as claimed in claim 1, wherein said further layer is one of an aluminum and an aluminum alloy.

3. A method as claimed in claim 2, wherein the elevated temperature to which said further layer is subjected is less than 500° C.

4. A method as claimed in claim 3, wherein the elevated temperature to which said further layer is subjected is in excess of 400° C.

* * * * *